(12) United States Patent  (10) Patent No.: US 8,283,560 B2
Slager  (45) Date of Patent: Oct. 9, 2012

(54) PHOTOVOLTAIC DEVICE

(75) Inventor: Ben Slager, Rhenen (NL)

(73) Assignee: Solarexcel B.V., Venray (NL)

( * ) Notice: Subject to any disclaimer, the term of this patent is extended or adjusted under 35 U.S.C. 154(b) by 0 days.

(21) Appl. No.: 12/734,420

(22) PCT Filed: Nov. 5, 2008

(86) PCT No.: PCT/EP2008/064996
§ 371 (c)(1),
(2), (4) Date: Apr. 30, 2010

(87) PCT Pub. No.: WO2009/059998
PCT Pub. Date: May 14, 2009

(65) Prior Publication Data
US 2010/0243051 A1    Sep. 30, 2010

(30) Foreign Application Priority Data
Nov. 5, 2007    (EP) .................................... 07021458

(51) Int. Cl.
H02N 6/00    (2006.01)
H01L 31/042    (2006.01)
H01L 31/00    (2006.01)

(52) U.S. Cl. .................. 136/257; 136/247; 136/256

(58) Field of Classification Search .................. 136/256, 136/257, 247
See application file for complete search history.

(56) References Cited

U.S. PATENT DOCUMENTS

| | | | |
|---|---|---|---|
| 3,912,931 A | 10/1975 | Gravisse et al. | |
| 4,153,813 A | 5/1979 | Blieden et al. | |
| 4,200,472 A | 4/1980 | Chappell et al. | |
| 4,202,704 A | 5/1980 | Hodgson et al. | |
| 4,413,157 A | 11/1983 | Ames | |
| 4,427,839 A | 1/1984 | Hall | |
| 4,576,850 A | 3/1986 | Martens | |
| 4,626,613 A | 12/1986 | Wenham et al. | |
| 4,629,821 A | 12/1986 | Bronstein-Bonte et al. | |
| 5,702,538 A | 12/1997 | Endros et al. | |
| 5,709,922 A | 1/1998 | Ono et al. | |
| 6,075,652 A | 6/2000 | Ono et al. | |
| 6,855,371 B2 | 2/2005 | Gier et al. | |
| 7,368,655 B2 | 5/2008 | Blieske et al. | |
| 2002/0084545 A1 | 7/2002 | Doi et al. | |

(Continued)

FOREIGN PATENT DOCUMENTS

CA    2 508 740 A1    6/2004

(Continued)

OTHER PUBLICATIONS

Hovel et al; "The Effect of Fluorescent Wavelength Shifting on Solar Cell Spectral Response;" *Solar Energy Materials 2*; 1979; pp. 19-29; North-Holland Publishing Company.

(Continued)

*Primary Examiner* — Basia Ridley
*Assistant Examiner* — Allison Bourke
(74) *Attorney, Agent, or Firm* — Oliff & Berridge, PLC

(57) ABSTRACT

A photovoltaic device including at least one active layer and a transparent cover plate which contains on at least one side an array of geometrical optical relief structures and which is in optical contact with a surface receiving side of the at least one active layer of a photovoltaic device, characterized in that the optical relief structures include a base and a single apex which are connected by at least three n-polygonal surfaces where n is equal to 4 or higher.

22 Claims, 5 Drawing Sheets a)

b)

U.S. PATENT DOCUMENTS

| | | |
|---|---|---|
| 2004/0026832 A1 | 2/2004 | Gier et al. |
| 2004/0086716 A1 | 5/2004 | Weikinger |
| 2004/0175192 A1 | 9/2004 | Tsukuda et al. |
| 2005/0039788 A1 | 2/2005 | Blieske et al. |
| 2006/0172119 A1 | 8/2006 | Hayashi et al. |
| 2007/0204902 A1 | 9/2007 | Dutta |
| 2007/0240754 A1 | 10/2007 | Gayout et al. |
| 2009/0071531 A1 | 3/2009 | Dame |
| 2010/0186798 A1 | 7/2010 | Tormen et al. |
| 2010/0243051 A1 | 9/2010 | Slager |
| 2011/0005593 A1 | 1/2011 | Slager |

FOREIGN PATENT DOCUMENTS

| | | |
|---|---|---|
| CH | 693 771 A5 | 1/2004 |
| DE | 29 24 045 A1 | 12/1980 |
| DE | 42 01 126 A1 | 6/1992 |
| DE | 199 54 954 A1 | 5/2001 |
| DE | 100 01 135 A1 | 7/2001 |
| EP | 0 012 217 A2 | 6/1980 |
| EP | 1 054 456 A2 | 11/2000 |
| JP | 57-152172 A | 9/1982 |
| JP | 10-163513 A | 6/1998 |
| JP | 2004-297025 A | 10/2004 |
| JP | A 2005-150242 | 6/2005 |
| WO | WO 97/19473 A1 | 5/1997 |
| WO | WO 03/046617 A1 | 6/2003 |
| WO | WO 2005/111670 A1 | 11/2005 |
| WO | WO 2008/145176 A1 | 12/2008 |
| WO | WO 2009/059998 | 5/2009 |

OTHER PUBLICATIONS

Blieske et al; "Light-Trapping in Solar Modules Using Extra-White Textured Glass;" 3$^{rd}$ *World Conference on Photovoltaic Energy Conversion*; May 11-18, 2003; pp. 188-191; Osaka, Japan.

Landis; "A Light-Trapping Solar Cell Coverglass;" *IEEE Xplore*; 1990; pp. 1304-1307; NASA Lewis Research Center 302-1.

International Search Report mailed on Jan. 19, 2009 in corresponding International Application No. PCT/EP2008/064996.

International Preliminary Report on Patentability completed on Feb. 11, 2010 in corresponding International Application No. PCT/EP2008/064996.

Written Opinion of the International Searching Authority mailed on Jan. 19, 2009 in corresponding International Application No. PCT/EP2008/064996.

E. Manea et al., Optimization of Front Surface Texturing Processes for High-Efficiency Silicon Solar Cells, *Solar Energy Materials and Solar Cells*, Elsevier Science Publishers, Amsterdam, NL, pp. 423-431, May 1, 2005.

M. Green et al., Recent Progress in Silicon Solar Cells, *Optoelectronic and Microelectronic Materials Devices*, Proceeding S. 1998 Conference in Perth, Australia, pp. 1-6, Dec. 14, 1998.

International Search Report for PCT/EP2009/052548, mailed Apr. 14, 2009.

International Preliminary Report on Patentability for PCT/EP2009/052548, mailed May 31, 2010.

International Search Report issued in International Patent Application No. PCT/EP2009/057495 mailed Sep. 28, 2009.

Written Opinion issued in International Patent Application No. PCT/EP2009/057495 mailed Sep. 28, 2009.

International Preliminary Report on Patentability issued in International Patent Application No. PCT/EP2009/057495 mailed Oct. 15, 2010.

Maruyama et al.; "Transformations of the wavelength of the light incident upon solar cells;" Solar Energy Materials & Solar Cells; 69; (2001); pp. 207-216.

Shalav et al.; "Luminescent layers for enhanced silicon solar cell performance: Up-conversion;" Solar Energy Materials & Solar Cells; 91; (2007); pp. 829-842.

Zhao et al.; "22.7% Efficient Silicon Photovoltaic Modules with Textured Front Surface;" IEEE Transactions on Electron Devices; vol. 46; No. 7; Jul. 1999; pp. 1495-1497.

U.S. Appl. No. 13/000,894, filed Dec. 22, 2010.

Office Action mailed Mar. 2, 2011 in pending U.S. Appl. No. 12/921,628.

Dictionary.com, Definition of Apex, <http://dictionary.reference.com/browse/apex>, accessed Feb. 24, 2011.

Sep. 22, 2010 International Search Report issued in PCT/EP2010/054640.

P. Sánchez-Friera et al., "Daily Power Output Increase of Over 3% with the use of Structured Glass in Monocrystalline Silicon PV Modules," IEEE 4th World Conference on Photovoltaic Energy Conversion, 2156-2159 (2006).

Sep. 22, 2010 Written Opinion issued in PCT/EP2010/054640.

Nov. 25, 2010 International Search Report issued in PCT/EP2010/054639.

Nov. 25, 2010 Written Opinion issued in PCT/EP2010/054639.

Sep. 21, 2011 Notice of Allowance issued in U.S. Appl. No. 12/921,628.

Oct. 21, 2011 Supplemental Notice of Allowance issued in U.S. Appl. No. 12/921,628.

U.S. Appl. No. 13/263,603, filed Oct. 7, 2011.

U.S. Appl. No. 13/263,256, filed Oct. 6, 2011.

a)

b)

a)

b)

a)

b)

c)

PHOTOVOLTAIC DEVICE

BACKGROUND

The invention pertains to a photovoltaic device which comprises at least one active layer and a cover plate that contains on at least one side an array of optical structures and which is in optical contact with the light receiving surface of the active layer(s) in order to reduce the reflection losses of said surface. Said plate or sheet may also be used in combination with luminescent molecules, which are inside or in contact with said plate, to improve the spectral response of the photovoltaic device.

Photovoltaic devices are commonly used to convert light energy into electrical energy. These devices contain an active layer which consists of a light absorbing material which generates charge carriers upon light exposure. An active layer which is currently common in photovoltaic devices is silicon. However, a variety of materials can be encountered like for example gallium arsenide (GaAs), cadmium telluride (CdTe) or copper indium gallium diselenide (CIGS). The charges, which are generated in the active layer, are separated to conductive contacts that will transmit electricity. Due to the thin and brittle nature of the active layer it is usually protected from external influences by a transparent cover plate e.g. made of glass. It is known from the art that both the active layer and the cover plate reflect a part of the light incident to the photovoltaic device. Especially the high refractive index of the active layer causes large reflection losses which can—in the case of silicon—be up to 22% of the incident light. Since the reflected light can not be converted into electrical energy these reflection losses cause a large reduction in the efficiency of a photovoltaic device.

Another effect that reduces the efficiency of a photovoltaic device is the low quantum efficiency of the active layer for usually short wavelengths, like for example ultra violet (UV) or blue light. This low response is caused by the band-gap of the material. The band gap refers to the energy difference between the top of the valence band and the bottom of the conduction band, where electrons are able to jump from one band to another. Due to the band-gap, the active layer has an optimal wavelength around which light energy is most efficiently converted into electrical energy. Light with a wavelength that is higher or lower than the optimum wavelength is less efficiently converted into electrical energy. A second effect that can reduce the spectral response of a photovoltaic device in the short wavelength range is the absorption of light by the cover plate. Although the cover plate is usually transparent to visible light it often absorbs in the UV range. As a result this light cannot reach the active layer of the photovoltaic device and cannot be converted into electrical energy.

In order to reduce these reflection losses, an anti reflection coating can be applied on top of the light absorbing material or so called active layer. An anti reflection coating consists of a single quarter-wave layer of a transparent material with a refractive index that is between the refractive index of the active layer and the cover plate. Although this theoretically gives zero reflectance at the center wavelength and decreased reflectance for wavelengths in a broad band around the center, the processing and material costs of these layers are relatively high. Also the processing techniques to create the coatings (e.g. chemical vapor deposition) are comprehensive and time consuming. In addition, the anti-reflection coating only works on the surface to which it is applied. It is therefore not possible to reduce both the reflection of the active layer and the cover plate by using one single anti reflection coating on either of these surfaces.

Another method to reduce the reflection losses is to structure the surface of the active layer. This can be done by either direct structuring of the material itself or by surface structuring of the substrate on which said material is deposited. By structuring the active layer, with common pyramid or V-shaped structures, a reduction in the reflection losses at active layer is obtained by multiple reflection at the surface offering the light a greater opportunity to enter the panel. This effect reduces the reflection losses at the surface of the active layer and is therefore often referred to as an anti-reflection effect. Secondly, the structures may in some cases partially trap the light which is not absorbed by the active layer and reflected by surface of the substrate. As a result the chance of light absorption by the active layer is increased. Although structuring of the active layer can significantly improve the efficiency of a photovoltaic cell, production methods are very complicated and extremely expensive. Often processes like wet chemical etching, mechanical etching or reactive ion etching are used to realize the desired effect. Also the structuring of the active layer does not reduce the reflection losses of the cover plate.

It is known from the art that the same concept as described in the previous paragraph can be used to improve the light transmission of a glass plat; i.e., the cover plate. Here, V-shaped (G. A. Landis, $21^{st}$ IEEE photovoltaic specialist conference, 1304-1307 (1990)) or pyramidal structures as disclosed in WO 03/046617 are applied to a glass plate to reduce the reflection losses of said plate and hence increase its transmission. The structures can be applied to the glass plate via for example casting or pressing. However, when using the plate as a cover plate of a photovoltaic device, the maximum efficiency of said device can only be increased by 6%, which is a reduction of approximately 30% of the reflection losses, according to a model study (U. Blieske et al., $3^{rd}$ World Conference on Photovoltaic Energy Conversion, 188-191 (2003)). In practice the results are even less and only 3% can be obtained. Although the structures reduce some of the reflection losses of the active layer, it reduces predominantly the reflection losses of the cover plate. Hence the total reduction in reflection losses, and increase in efficiency of the photovoltaic device, is low.

SUMMARY

It is therefore an object of the present invention to improve the efficiency of a photovoltaic device and to provide a photovoltaic device in which the reflection losses, especially the reflection losses of the active layer are further reduced.

This object is achieved by a photovoltaic device comprising at least one active layer and a transparent cover plate which contains on at least one side an array of geometrical optical relief structures and which is in optical contact with a surface receiving side of the at least one active layer of a photovoltaic device, characterized in that the optical relief structures comprise a base and a single apex which are connected by at least three n-polygonal surfaces where n is equal to 4 or higher.

The apex is defined as the upper part of an individual geometrical optical relief structure. The apex is a single most distant point of an individual geometrical optical relief structure contrasting with the base. The apex is that point of which the distance to the base is the longest, measured in a straight line perpendicular to the base.

DETAILED DESCRIPTION

Figure 1:
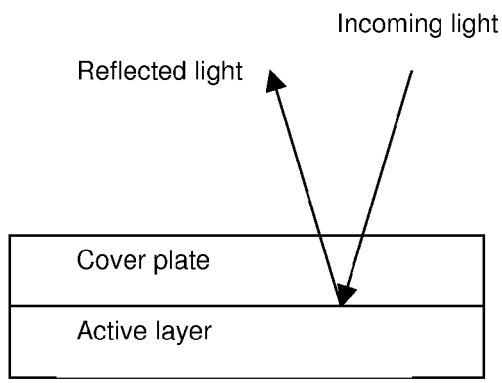
FIGS. 1 a) and b)—Schematic representation of reduction in reflection losses of the active layer by the structured plate.
Figure 1:
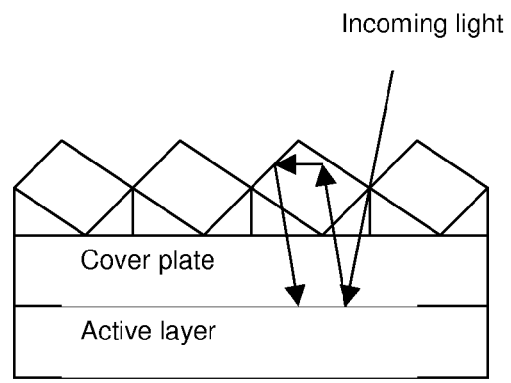

Although the transparent cover plate could contain only one individual geometrical optical relief structure it is preferred that the transparent cover plate contains an array of geometrical optical relief structures. An array is to be understood as a collection or group of elements, in this case individual optical relief structures, placed adjacent to each other or arranged in rows and columns on one substrate. Preferably the array contains at least 4 geometrical optical relief structures.

Surprisingly it could be shown that the cover plate comprising the optical relief structures reduces the reflection losses of the light receiving surface of the active layer of a photovoltaic device, with the provision that said cover plate is placed in optical contact with the light receiving side of said active layer. If this requirement is not fulfilled the transmission through said plate to said active layer is reduced such that it is equal or lower than compared to a non structured surface.

Preferably the base of the optical relief structure comprises an m-sided polygonal shape and the optical structure contains in total of at least m+1 surfaces.

These given requirements for an optical relief structure according to the present invention are not fulfilled in the case of a V-shaped or any pyramid structures. An example of an individual geometrical optical relief structure according to the invention is given in FIG. 3. This example is by no means meant to limit the invention. Here the geometrical optical relief structure clearly contains 3 square surfaces which directly connect the hexagonal base to a single apex and the structure contains 9 surfaces in total. This structure is different from any V-shaped structure or any pyramid known from prior art. A repeating V-shaped structure contains per definition only parallel surfaces. A pyramid structure contains per definition n triangles which connect the n-polygonal base to the apex. The structure described in FIG. 3 fulfills neither of these requirements.

The geometrical optical relief structure according to the invention has two principle functions:
1. Light which enters the structure via the n-sided polygonal base is at least partially reflected to its original direction by the surfaces of said structure.
2. Light which enters the structure via the surfaces of said structure is at least partially transmitted.

In a preferred embodiment of the invention a single geometrical optical structure should be converging over all surfaces of which the structure is comprised. Preferably the angle between the base and any surface should be 90° or less.

In another preferred embodiment of the invention, the transparent cover plate contains an array of geometrical optical relief structures with adjacent structures abutting each other. The structures can be placed such that the orientation of all structures is the same, alternating or random with respect to each other.

It is known that the reflection losses for a flat surface depend on the angle of incidence $\phi$. In the case of a flat surface the reflection losses are small when the light source i.e. the sun is perpendicular ($\phi=0°$) to the surface. The reflection losses increase to a maximum when the angle of incidence $\phi$ is 90°, i.e. the light source is parallel to the surface of the photovoltaic device. A similar effect, although the trend is different, is observed for the array of pyramid structures known from prior art. In both cases the reflection losses are however at, least to a large extent, independent of the $\theta$ angle. The $\theta$ angle which may also be referred to as the directional angle, is the angle which determines the north, east, south, west position of the light source, i.e. the sun with respect to the device. Surprisingly for an array of geometrical optical relief structures according to the invention the reduction in reflection losses depends significantly on the $\theta$ angle. Due to this dependency the orientation of the array of geometrical optical relief structures with respect to the trajectory of the sun has significant influence on the performance of the photovoltaic device. In a preferred embodiment of the photovoltaic device according to the invention the array is therefore positioned in such a way that the optimal performance for $\theta$ is achieved at maximum light intensity.

When describing the n-polygonal base of the optical structure by a circle wherein the edges of the polygonal base lie on the circumferential line of the circle, the diameter D of the circle is preferably less than 30 mm, more preferably less than 10 mm and most preferably less than 3 mm.

The height of structures depends on the diameter D of the base and is preferably between 0.1*D and 2*D.

In a preferred embodiment of the photovoltaic device according to the invention the surfaces of the array of optical relief structures are covered with a coating. The coating may be an anti-fogging coating, anti-fouling coating, anti-scratch coating or the like.

In a more preferred embodiment of the photovoltaic device according to the invention the coating has a different refractive index than the optical relief structures and the shape of the coating is complementary to the array of geometrical optical relief structures and that the photovoltaic device with the coating has an even non-relief structures. For example, it is possible to create the optical relief structures in a high refractive index material and coat it with a low refractive index material such that there is no relief structure after coating. In other words, the high refractive optical relief structures are "filled" with low refractive index material.

The cover plate comprising the optical relief structures can be made of any transparent material. A transparent material is to be understood as a material which has a linear absorption of less than 0.2 $mm^{-1}$ within the range of 400-1200 nm. Preferably the optical relief structures are made of a polymeric material. Examples for polymeric materials are polycarbonate, polymethylmethacrylate, polypropylene, polyethylene, polyamide, polyacrylamide or any combinations thereof. The polymer is preferably stabilized by UV absorbers and/or hindered amine light stabilizers.

In another preferred embodiment the optical relief structures are made of a glass, e.g. silicate glass or quartz glass.

The thickness of the plate is preferably less than 30 mm, more preferably less than 10 and most preferably less than 3 mm.

The cover plate comprising the optical relief structures according to the invention may be obtained by processes known in the art, e.g. injection molding, thermo calendaring, laser structuring, photo-lithographic methods, powder pressing, casting, grinding or hot pressing.

To overcome the effect of low spectral response, especially of the lower wavelengths, of the active layer of a photovoltaic device luminescent dyes can be applied on or above the active layer. Said luminescent dyes improve the spectral response of the device by converting wavelengths which are not efficiently used by said layer to wavelengths which are more efficiently used. The luminescent molecules of the dye absorb short wavelengths and re-emit the light at a longer wavelength.

Therefore, the present invention also pertains to a photovoltaic device as initially described in which a luminescent dye is present in the transparent cover plate that contains the array of optical relief structures.

Part of the light emitted by the luminescent molecules of the luminescent dye can however not be used by the active layer of prior art photovoltaic devices because it is directed away from the active layer, or because it is reflected by said layer due to its high refractive index. As a result luminescent dyes can in practice only increase the efficiency of prior art photovoltaic devices by approximately 2% (H. J. Hovel et al., *Solar energy materials*, 2, 19-29 (1979)).

When combining a photovoltaic device according to the present invention with luminescent dyes known in the art, surprisingly a synergetic effect occurs in which the spectral response of a photovoltaic device is improved beyond what would be expected from the simple addition of luminescent molecules of the luminescent dye.

It should be noted, however, that when luminescent molecules are added to the transparent cover plate, said plate might become non transparent within a least a part of the wave length range between 400-1200 nm.

Figure 2:
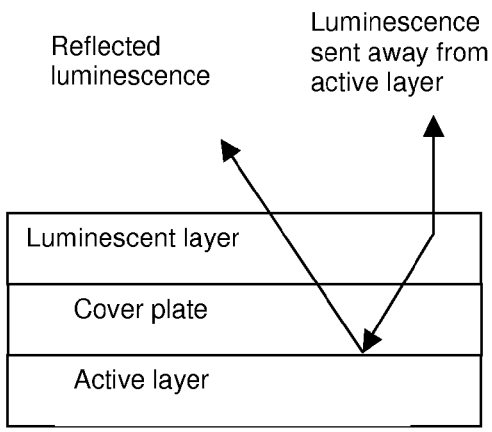
FIGS. 2 *a*) and *b*)—Schematic representation of the increase in spectral response by the plate comprising the optical structures and the luminescent molecules.
Figure 2:
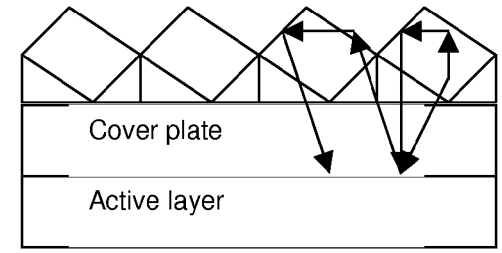

When adding luminescent molecules to the transparent cover plate comprising the optical relief structures according to the invention, the spectral response of the photovoltaic device is improved compared to a non structured surface (See FIG. 2). The transparent cover plate comprising the optical structures increases the absorption of light emitted by the luminescent molecules at the light receiving surface of the active layer of the photovoltaic device by reducing the reflection losses of luminescent light and redirecting luminescent light emitted away from the active layer back to the active layer. The luminescent molecules are preferably distributed inside the plate, but can also be present in a separate layer between the transparent cover plate which contains the array of optical relief structures and the light receiving surface of the active layer of the photovoltaic device. Optical contact between the transparent cover plate comprising the optical relief structures and/or the layer containing the luminescent molecules and the light receiving surface of the active layer of a photovoltaic device is required.

Also the array of optical structures according to the invention can reduce the required concentration of luminescent dye and layer thickness. The amount of light converted into another wavelength by a luminescent dye is related to the amount of light absorbed by said dye, which in its turn is related to the layer thickness and the dye concentration according to the Lamber-Beer law:

$$\text{Absorbance} = \epsilon * [C] * l \tag{1}$$

$\epsilon$=molar extinction coefficient in [L mol$^{-1}$ cm$^{-1}$]
[C]=concentration of dye in [mol L$^{-1}$]
l=layer thickness in [cm].

To ensure that most of the incident light is absorbed, and thus the luminescent molecules are used optimally, either $\epsilon$, l or [C] has to be large. Since $\epsilon$ is an intrinsic property of the dye and can not be altered, and [C] is limited since luminescent dyes have a limited solubility into a matrix materials such as polymers, it is thus necessary to have a thick layer (l). Due to the thick layer required and high costs of the luminescent dyes itself this is relatively expensive.

The synergetic effect of the luminescent molecules in combination with the array of optical structures according to the invention is thus not limited to an increase in output. The array of optical structures increases the path length of incident light through the layer containing the luminescent dye. As a result, a lower concentration of luminescent molecules and thinner layers can be used without a reduction in efficiency.

The luminescent molecules which may be used can for example be fluorescent or phosphorescent and said molecules can be both down-conversion luminescent and up-conversion luminescent. The preferred molecules are fluorescent and can for example be any perelyne, coumarin, rhodamine, naphthalimide, benzoxanthene, acridine, auramine, benzanthrone, cyanine, stilbene, rubrene, leciferin or derivatives thereof.

The luminescent dye containing the luminescent molecules is thus preferably an organic dye. The luminescent dye may, however, also be an inorganic dye. Preferably the luminescent dye acts as an UV absorber to stabilize the polymer building the transparent cover plate.

The luminescent dye may comprise a mixture of several luminescent dyes. The concentration of the luminescent dye preferably lies between 0.001 and 50 gram dye per m$^2$ cover plate surface and per mm cover plate thickness.

Whether optical contact is achieved depends on the refractive index ($n_d$) of the medium or media that connect the transparent plate comprising the array of optical relief structures and the photovoltaic device. If a medium between said components is non-existing, optical contact is per definition achieved. In all other cases optical contact is achieved when the refractive index of the medium or media between the components is on average at least 1.2. More favorably the refractive index of the medium or media is on average at least 1.3 and most favorably the refractive index of the medium is at least 1.4. To determine the refractive index of a medium an Abbe refractometer should be used.

For example, in case the transparent cover plate comprising the array of optical structures is made of polymethylmethacrylate with $n_d$=1.5, the active layer of the photovoltaic device is made of silicon $n_d$=3.8 and the medium between these two components is air $n_d$=1, no optical contact is achieved.

In case the transparent cover plate comprising the array of optical structures is made of polymethylmethacrylate with $n_d$=1.5, the active layer of the photovoltaic device is made of silicon $n_d$=3.8 and the medium is an adhesive with a refractive index of $n_d$=1.5, optical contact is achieved.

Whether optical contact is achieved does not depend on the distance between the transparent cover plate and/or the layer comprising the luminescent molecules and the surface receiving surface of the active layer of a photovoltaic device.

A photovoltaic device according to the invention may reduce the reflection losses of the active layer of the photovoltaic device by 30% or even more than 60% as compared to a non structured surface.

The invention relates to a photovoltaic device comprising at least one active layer and a transparent cover plate which contains on at least one side an array of geometrical optical relief structures and which is in optical contact with a surface receiving side of the at least one active layer of a photovoltaic device, characterized in that the optical relief structures comprise a base and a single apex which are connected by at least three n-polygonal surfaces where n is equal to 4 or higher. In view of the present invention also a plate containing on at least one side an array of geometrical optical relief structures according to the present invention falls under the scope of the present invention provided that it is manufactured for the purpose of using it in combination with a photovoltaic device.

To elucidate, but not to limit the extent of the invention several examples are given in the following:

Comparative Example 1

Figure 6:
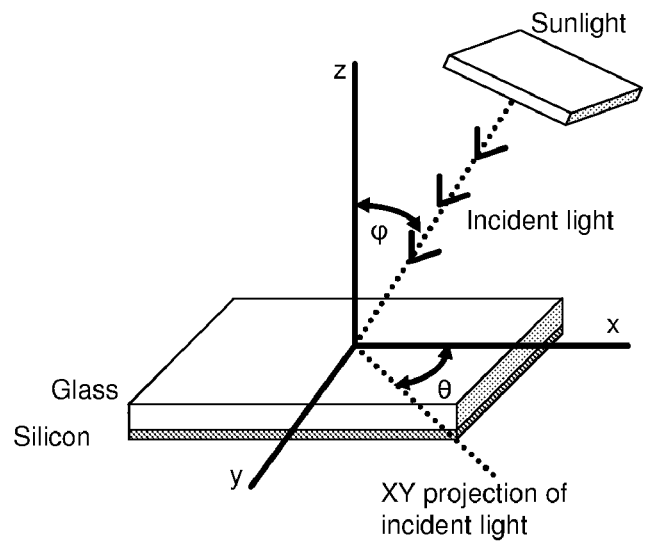
FIG. 6—Experimental setup for measuring the reflection losses of a photovoltaic device with a non-structured cover plate.

A raytrace study was performed in which the reflection losses of a photovoltaic device, which consists of a non structured cover glass in optical contact with a silicon layer, was simulated. The experimental setup is illustrated in FIG. 6.

The simulated photovoltaic device consisted of a thin layer which has the optical properties of silicon ($n_d$=4.295 at λ=500 nm, absorption coefficient 889/mm). This layer is in direct contact with a 3.5 mm thick layer which has the optical properties of glass ($n_d$=1.5 at λ=500 nm, absorption coefficient 0/mm).

The sunlight was simulated by placing a collimated light source above the simulated photovoltaic device. The light source emitted a total of 1000 rays with a total intensity 1000 W and a wavelength of 500 nm.

The reflection losses are determined by comparing the intensity of the incident light and the amount of light absorbed by the thin layer with the optical properties of silicon. The amount of reflected light is calculated from the difference between the incident and the absorbed light. In the table below the reflection losses, averaged over the angle θ, are given as function of the angle of incidence (φ). When φ is 0, the light source is perpendicular to the simulated photovoltaic device. The reflection losses under low angles are particularly important since in practice this corresponds to situations involving high intensity and/or direct sunlight. The high angles are less important and correspond to situations of low intensity and/or diffuse sunlight and do contribute less to the efficiency of the photovoltaic device.

It can be observed that a significant amount of light is reflected under all angles. It is therefore concluded that the efficiency of a photovoltaic device, consisting of silicon layer and which is in optical contact with a glass cover plate, is significantly reduced by the reflection losses from these layer.

Comparative Example 2

A raytrace study was performed in which the reflection losses of a photovoltaic device, comprising of a cover glass which is structured with an array of pyramid structures known in the art and is in optical contact with a silicon layer.

The simulated photovoltaic device consisted of a thin layer which has the optical properties of silicon ($n_d$=4.295 at λ=500 nm, absorption coefficient 889/mm). This layer is in direct contact with a 3.5 mm thick layer which has the optical properties of glass ($n_d$=1.5 at λ=500 nm, absorption coefficient 0/mm) and of which the surface opposing the thin layer with optical properties of silicon, was textured with an array of 20×20 pyramid structures. The pyramid structures had a 3×3 mm square base and a half angle of 45°.

The sunlight was simulated by the same setup as described in comparative example 1.

When comparing these results with the results from comparative example 1 it can be observed that structuring the cover glass with an array of pyramid structures reduces the reflection losses of the photovoltaic device.

Example 1

A raytrace study was performed in which the reflection losses of a photovoltaic device according to the invention were simulated.

The simulated photovoltaic device consisted of a thin layer that has the optical properties of silicon ($n_d$=4.295 at λ=500 nm, absorption coefficient 889/mm). This layer is in direct contact with a 3.5 mm thick layer which has the optical properties of glass ($n_d$=1.5 at λ=500 nm, absorption coefficient 0/mm) and of which the surface opposing the thin layer with optical properties of silicon, was textured with an array of 20×20 optical relief structure, the individual optical relief structures exhibited a shape as shown in FIG. 2.

The sunlight was simulated by the same setup as described in comparative example 1.

When comparing these results with the results from comparative example 1 and 2 it can be observed that under low angles between 0-15° the reflection losses are reduced up to 19.6% as compared to non structured glass cover plate and up to 7.2% as compared to a cover plate structured with an array of pyramids known from prior art. Also under high angles between 50°-90° the reflection losses are reduced as compared to a non-structured and a pyramid structured glass cover plate.

It is concluded that the efficiency of a photovoltaic device, consisting of silicon layer and which is in optical contact with a glass cover plate having a structure according to the invention, is significantly increased compared to a non structured glass cover plate and a pyramid structures cover plate known in the art. The reduction in reflection losses, and consequently the increase in efficiency of the photovoltaic device, is particularly large between 0-15° and 50-90°.

The results of Comparative Example 1 and 2 and the results of Example 1 are given in the following table:

TABLE 1

Reflection losses of a photovoltaic device with a non-structured cover plate (Comparative Example 1), reflection losses of a photovoltaic device with a pyramid textured surface (Comparative Example 2) and Reflection losses of a photovoltaic device with a surface structure according to the invention (Example 1).

| Angle of incidence [°] | Comparative Example 1 Reflection losses [%] | Comparative Example 2 Reflection losses [%] | Example 1 Reflection losses [%] |
|---|---|---|---|
| 0 | 25.8 | 13.4 | 6.2 |
| 5 | 25.8 | 13.7 | 6.7 |
| 10 | 25.8 | 16.1 | 9.4 |

TABLE 1-continued

Reflection losses of a photovoltaic device with a non-structured cover plate (Comparative Example 1), reflection losses of a photovoltaic device with a pyramid textured surface (Comparative Example 2) and Reflection losses of a photovoltaic device with a surface structure according to the invention (Example 1).

| Angle of incidence [°] | Comparative Example 1 Reflection losses [%] | Comparative Example 2 Reflection losses [%] | Example 1 Reflection losses [%] |
|---|---|---|---|
| 15 | 25.8 | 17.1 | 12.7 |
| 20 | 25.8 | 16.3 | 14.7 |
| 25 | 25.8 | 16.3 | 15.3 |
| 30 | 25.9 | 15.9 | 16.9 |
| 35 | 26.0 | 16.0 | 17.9 |
| 40 | 26.1 | 16.3 | 18.3 |
| 45 | 26.4 | 18.3 | 18.4 |
| 50 | 26.9 | 19.6 | 17.6 |
| 55 | 27.7 | 19.9 | 16.1 |
| 60 | 28.9 | 19.3 | 14.4 |
| 65 | 30.9 | 20.8 | 15.0 |
| 70 | 34.0 | 20.7 | 15.4 |
| 75 | 39.4 | 20.1 | 18.1 |
| 80 | 48.6 | 22.7 | 21.5 |
| 85 | 65.5 | 24.2 | 17.5 |

Comparative Example 3

A raytrace study was performed to investigate the quantity of light absorbed by a photovoltaic device and which is emitted by luminescent molecules in a separate layer on top of a photovoltaic device.

The simulated photovoltaic device consisted of a thin layer that has the optical properties of silicon ($n_d$=4.295 at λ=500 nm, absorption coefficient 889/mm). This layer is in direct contact with a 3.5 mm thick layer which has the optical properties of glass ($n_d$=1.5 at λ=500 nm, absorption coefficient 0/mm).

An additional 1.25 mm thick layer was positioned on top of the photovoltaic device. This layer is in direct contact with the 3.5 mm thick layer that has the optical properties of glass ($n_d$=1.5 at λ=500 nm, absorption coefficient 0/mm) and has the same optical properties. In this layer 20 spherical light sources were randomly distributed. The light sources emit a total of a 1000 rays with a total intensity of a 1000 W.

It was observed that 547 W of the emitted light was absorbed by the silicon layer and 460 W is either reflected by the silicon layer or emitted away from the silicon layer.

Example 2

A raytrace study was performed to investigate the quantity of light absorbed by a photovoltaic device and which is emitted by luminescent molecules in a separate layer on top of a photovoltaic device. This layer is structured according to the invention.

The simulated photovoltaic device consisted of a thin layer that has the optical properties of silicon ($n_d$=4.295 at λ=500 nm, absorption coefficient 889/mm). This layer is in direct contact with a 3.5 mm thick layer that has the optical properties of glass ($n_d$=1.5 at λ=500 nm, absorption coefficient 0/mm).

An additional 1.25 mm thick layer was positioned on top of the photovoltaic device. This layer is in direct contact with the 3.5 mm thick layer that has the optical properties of glass ($n_d$=1.5 at λ=500 nm, absorption coefficient 0/mm) and has the same optical properties. The surface of this layer opposing the photovoltaic device was structured with a 20×20 array of structures according to the invention. In this layer 20 spherical light sources were randomly distributed. The light sources emit a total of a 1000 rays with a total intensity of a 1000 W.

It was observed that 653 W of the emitted light was absorbed by the silicon layer and 360 W is either reflected by the silicon layer or emitted away from the silicon layer. When comparing this result with the results from comparative example 3, it can be concluded that by structuring the layer containing the luminescent molecules with an array of structures according to the invention, the efficiency of the effect of the luminescent molecules can be increased up to 20%.

Example 3

Figure 7:
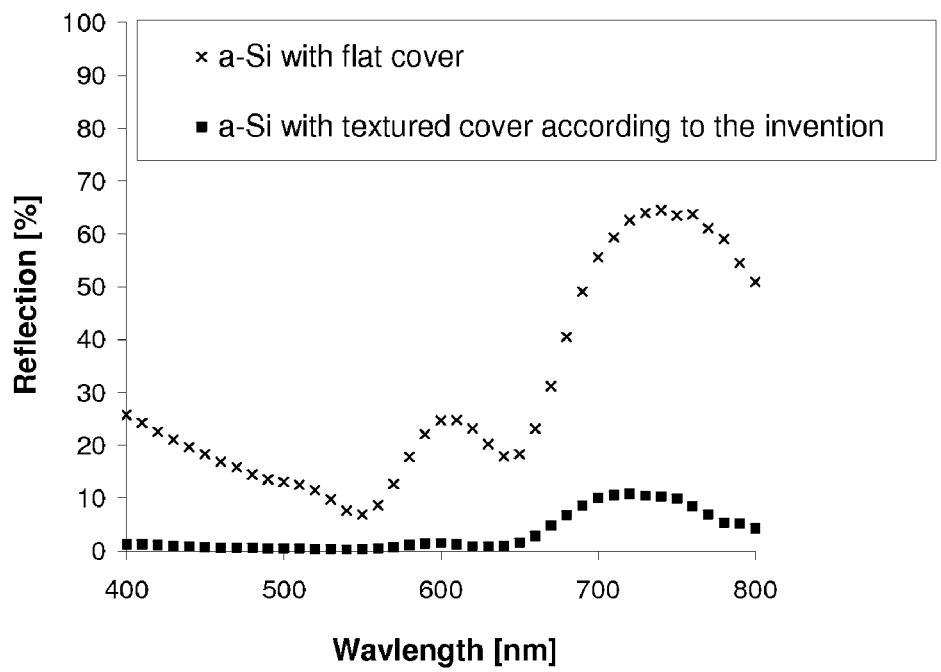
FIG. 7—Reflection losses from the surface of an amorphous silicon (a-Si) solar cell containing a flat glass front surface and reflection losses of an amorphous silicon solar cell comprising a front cover with an array of optical structures according to the present disclosure.

The reflection losses from the surface of an amorphous silicon (a-Si) solar cell containing a flat glass front surface as known from the prior art were determined by a UV-3100 UV-VIS-NIR spectrometer (Shimadzu) equipped with MCP-3100 external sample compartment. The solar cell was mounted at the back of the integrating sphere in the external sample compartment under an angle of 8-degree with respect to the incident sample beam. The reflection losses were compared to an amorphous silicon solar cell comprising a front cover with an array of optical structures according to the invention (as shown in FIG. 3a stacked in an array as FIG. 5c). The reflection losses of both solar cells are given in FIG. 7. It can be concluded that the solar cell containing comprising the front cover with an array of optical structures according to the invention has significantly less reflection losses. Between 500-700 nm the reflection losses were reduced from 20.8 to 2.0 percent.

Example 4

Figure 8:
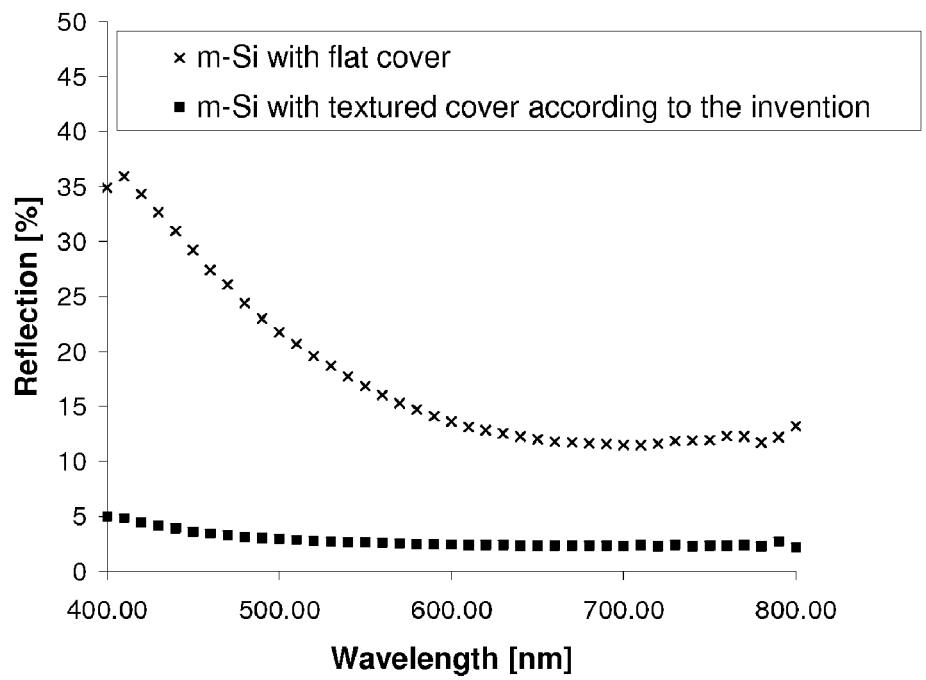
FIG. 8—Reflection losses from the surface of a monocrystalline silicon (m-Si) solar cell with an antireflection coating and a flat glass front surface and reflection losses of a monocrystalline silicon solar cell with an antireflection coating and a front cover with an array of optical structures according to the present disclosure.

The reflection losses from the surface of a monocrystalline silicon (m-Si) solar cell with an antireflection coating and a flat glass front surface as known from the prior art were determined by a UV-3100 UV-VIS-NIR spectrometer (Shimadzu) equipped with MCP-3100 external sample compartment. The solar cell was mounted at the back of the integrating sphere in the external sample compartment under an angle of 8-degree with respect to the incident sample beam. The reflection losses were compared to a monocrystalline silicon solar cell with an antireflection coating and a front cover with an array of optical structures according to the invention (as shown in FIG. 3a stacked in an array as FIG. 5c). The reflection losses of both solar cells are given in FIG. 8. It can be concluded that the solar cell containing a front cover with an array of optical structures according to the invention has significantly less reflection losses. Between 700-800 nm the reflection losses are reduced from 11.9 to 2.3 percent.

Example 5

Figure 9:
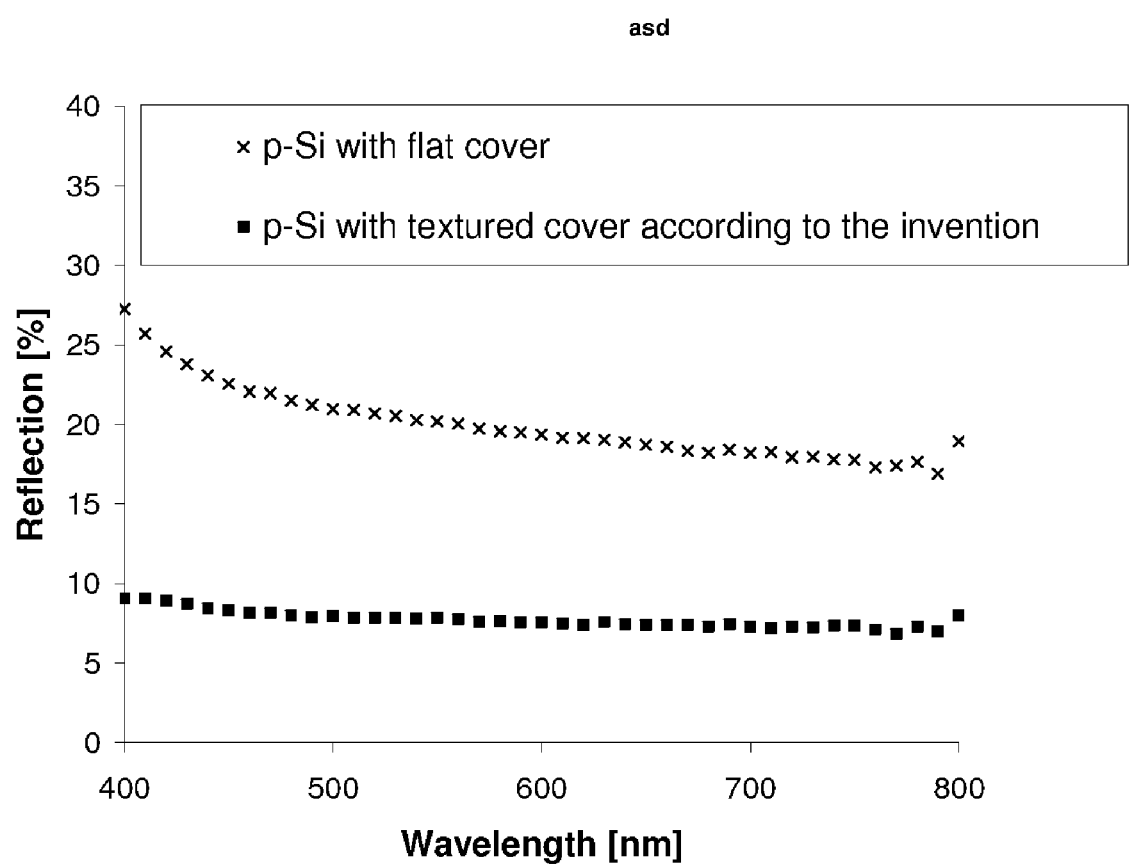
FIG. 9—Reflection losses from the surface of a polycrystalline silicon (p-Si) solar cell with a flat glass front surface and reflection losses of a polycrystalline silicon solar cell comprising a front cover with an array of optical structures according to the present disclosure.

The reflection losses from the surface of a polycrystalline silicon (p-Si) solar cell with a flat glass front surface as known from the prior art were determined by a UV-3100 UV-VIS-NIR spectrometer (Shimadzu) equipped with MCP-3100 external sample compartment. The solar cell was mounted at the back of the integrating sphere in the external sample compartment under an angle of 8-degree with respect to the incident sample beam. The reflection losses were compared to a polycrystalline silicon solar cell comprising a front cover with an array of optical structures according to the invention (as shown in FIG. 3a stacked in an array as FIG. 5c). The reflection losses of both solar cells are given in FIG. 9. It can be concluded that the solar cell containing a front cover with an array of optical structures according to the invention has significantly less reflection losses. Between 700-800 nm the reflection losses were reduced from 20.0 to 7.2 percent.

Example 6

The short circuit current (Isc) and open circuit voltage (Voc) of an amorphous silicon (a-Si) solar cell with a flat front cover and amorphous silicon solar cell with a structured front cover according to the invention (as shown in FIG. 3a stacked in an array as FIG. 5c) have been measured using a solar simulator. The results show that the Isc and Voc were significantly higher for an a-Si solar cell with a structured front cover according to the invention.
a-Si with a flat front cover:
Isc=9.54 mA
Voc=11.49 V
a-Si with a structured front cover according to the invention:
Isc=11.32 mA
Voc=11.62 V Example 7

The short circuit current (Isc) and open circuit voltage (Voc) of an monocrystalline silicon (m-Si) solar cell with an antireflection coating and a flat front cover and monocrystalline solar cell with and antireflection coating and a structured front cover according to the invention (as shown in FIG. 3a stacked in an array as FIG. 5c) have been measured using a solar simulator. The results show that the Isc and Voc were significantly higher for an m-Si solar cell with a structured front cover according to the invention.
m-Si with a flat front cover:
Isc=1.670 A
Voc=0.570 V
m-Si with a structured front cover according to the invention:
Isc=1.840 A
Voc=0.574 V Example 8

The short circuit current (Isc) and open circuit voltage (Voc) of a polycrystalline silicon (p-Si) solar cell with a flat front cover and a polycrystalline silicon (p-Si) solar cell with a structured front cover according to the invention (as shown in FIG. 3a stacked in an array as FIG. 5c) have been measured using a solar simulator. The results show that the Isc and Voc were significantly higher for a p-Si solar cell with a structured front cover according to the invention.
p-Si with a flat front cover:
Isc=1.480 A
Voc=0.552 V
p-Si with a structured front cover according to the invention:
Isc=1.540 A
Voc=0.558 V FIG. 1a shows a schematic representation of the reflection losses of the active layer with a prior art flat transparent cover plate in comparison with the reduction in reflection losses of the active layer by a cover plate comprising an array of optical relief structures as shown in FIG. 1b. The optical relief structures reduce the reflection losses of the light receiving surface of the active layer of a photovoltaic device. Light reflected from the active layer enters the optical relief structure via the base and is at least partially reflected to its original direction, i.e. to the active layer, by the surfaces of said optical relief structure.

FIG. 2a shows a schematic representation of the spectral response of a photovoltaic device with an active layer with a prior art flat transparent cover plate and an additional layer of luminescent dye. The cover plate comprising the optical structures in combination with luminescent molecules as shown in FIG. 2b improves the spectral response of the photovoltaic device compared to a non structured surface. The cover plate comprising the optical structures and luminescent molecules increases the absorption of light emitted by the luminescent molecules at the light receiving surface of the active layer of the photovoltaic device by reducing the reflection losses of emitted light and redirecting light emitted away from the active layer.

Figure 3:
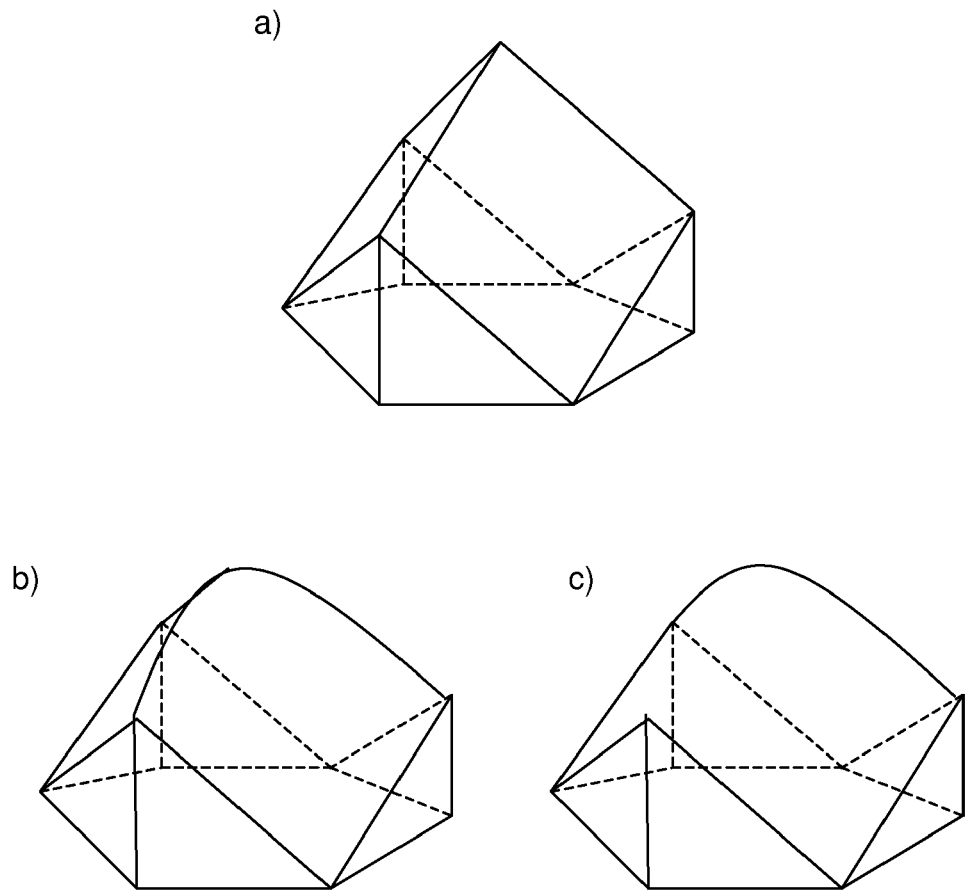
FIG. 3—Perspective view of an individual optical relief structure were a) n=4, b) n=∞, and c) n=∞.

FIG. 3 shows a perspective view of an individual optical relief structure according to the invention. FIG. 3a shows an optical relief structure containing 3 square surfaces (n=4) which directly connect the hexagonal base to a single apex and the structure contains 9 surfaces in total. FIGS. 3b, 3c show examples for partially rounded surfaces. A rounded, curved or partially curved surface is a n-polygonal surface where n is infinite.

Figure 4:
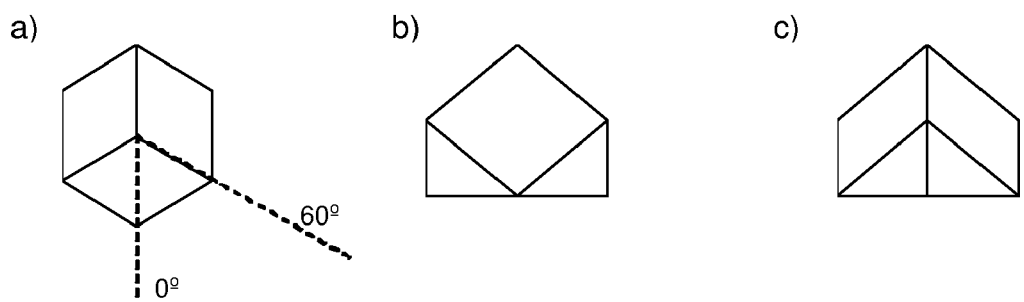
FIG. 4—a) top view b) side view 0° and c) side view 60° of an individual optical relief structure.

FIG. 4 shows the individual optical relief structure of FIG. 3 in a) top view, b) side view 0° and c) side view 60°.

Figure 5:
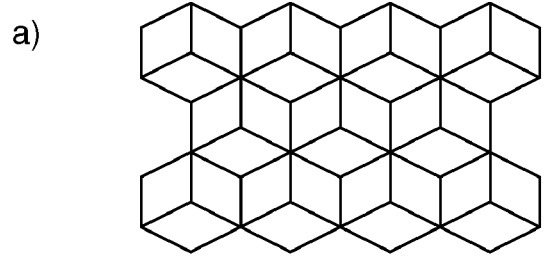
FIGS. 5 *a*), *b*) and *c*)—Schematic representation showing a part of an array of geometrical optical relief structures with adjacent structures abutting each other.
Figure 5:
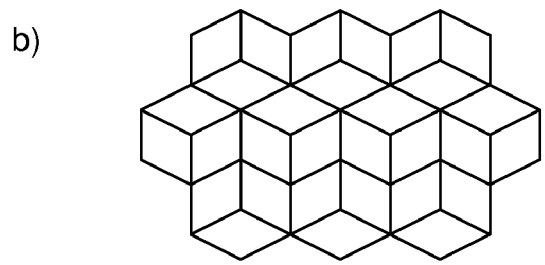
Figure 5:
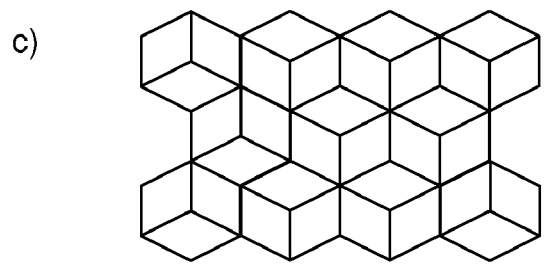

FIG. 5 is a schematic representation showing a part of an array of geometrical optical relief structures with adjacent structures abutting each other in top view. FIG. 5a shows the geometrical optical relief structures placed such that the orientation of all structures is the same with respect to each other. FIG. 5b shows the geometrical optical relief structures placed such that the orientation of the structures is alternating with respect to each other. FIG. 5c shows the geometrical optical relief structures placed such that the orientation of all structures is random with respect to each other.

FIG. 6 shows the experimental setup for measuring the reflection losses of a photovoltaic device with a non-structured cover plate. The simulated photovoltaic device consisted of a thin layer which had the optical properties of silicon. This layer is in direct contact with a layer which had the optical properties of glass. The sunlight was simulated by placing a collimated light source above the simulated photovoltaic device. The reflection losses are determined by comparing the intensity of the incident light and the amount of light absorbed by the thin layer with the optical properties of silicon. The amount of reflected light is calculated from the difference between the incident and the absorbed light. The figure also illustrates the angle θ and the angle of incidence (φ). The reflection losses, averaged over the angle θ, are given as function of the angle of incidence (φ). When φ is 0, the light source is perpendicular to the simulated photovoltaic device.

The invention claimed is:

1. A photovoltaic device comprising:
at least one active layer and
a transparent cover layer that comprises on at least one side an array of geometrical optical relief structures comprised of a plurality of individual geometrical optical relief structures, the array being in optical contact with a light receiving surface of the at least one active layer of the photovoltaic device,
wherein each individual geometrical optical relief structure of the array comprises a base and a single point apex, the single point apex and the base being connected by at least three n-polygonal surfaces, wherein n represents the number of sides of each polygonal surface and is equal to 4 or higher, and
wherein the base of each individual geometrical optical relief structure of the array has an m-sided polygonal shape and each individual geometrical optical relief structure of the array has at least m+1 surfaces, m representing the number of sides of the base.

2. A photovoltaic device according to claim 1, wherein the individual geometrical optical relief structures of the array are arranged with adjacent individual geometrical optical relief structures abutting other individual geometrical optical relief structures of the array.

3. A photovoltaic device according to claim 1, wherein an individual one of the geometrical optical relief structures of the array have a same orientation, an alternating orientation or a random orientation with respect to remaining ones of the individual geometric optical relief structures of the array.

4. A photovoltaic device according to claim 1, wherein at least one surface of the array of geometrical optical relief structures is covered with a coating.

5. A photovoltaic device according to claim 4, wherein the coating has a different refraction index than the individual geometrical optical relief structures and a shape of the coating is complementary to the array of geometrical optical relief structures.

6. A photovoltaic device according to claim 1, wherein the transparent cover layer is made of a glass.

7. A photovoltaic device according to claim 1, wherein the transparent cover layer is made of a polymeric material.

8. A photovoltaic device according to claim 7, wherein the polymeric material is polymethylmethacrylate.

9. A photovoltaic device according to claim 7, wherein the polymeric material is polycarbonate.

10. A photovoltaic device according to claim 7, wherein the polymeric material is stabilized by UV absorbers and/or hindered amine light stabilizers.

11. A photovoltaic device according to claim 1, wherein a luminescent dye is present in the transparent cover layer.

12. A photovoltaic device according to claim 1, wherein a luminescent dye is present in a layer between the transparent cover layer and a light receiving surface of the active layer of the photovoltaic device.

13. A photovoltaic device according to claim 11, wherein the luminescent dye comprises a mixture of several luminescent dyes.

14. A photovoltaic device according to claim 11, wherein a concentration of the luminescent dye is from 0.001 to 50 gram dye per $m^2$ cover layer surface and per mm cover layer thickness.

15. A photovoltaic device according to claim 11, wherein the luminescent dye is an organic dye.

16. A photovoltaic device according to claim 11, wherein the luminescent dye is an inorganic dye.

17. A photovoltaic device according to claim 11, wherein the transparent cover layer is made of a polymeric material, and the luminescent dye acts as a UV absorber to stabilize the polymeric material.

18. A photovoltaic device according to claim 12, wherein the luminescent dye comprises a mixture of several luminescent dyes.

19. A photovoltaic device according to claim 12, wherein a concentration of the luminescent dye is from 0.001 to 50 gram dye per $m^2$ cover layer surface and per mm cover layer thickness.

20. A photovoltaic device according to claim 12, wherein the luminescent dye is an organic dye.

21. A photovoltaic device according to claim 12, wherein the luminescent dye is an inorganic dye.

22. A photovoltaic device according to claim 12, wherein the transparent cover layer is made of a polymeric material, and the luminescent dye acts as a UV absorber to stabilize the polymeric material.

* * * * *